Oct. 6, 1964 M. T. MINAMOTO 3,152,023
METHOD OF MAKING SEMICONDUCTOR DEVICES
Filed Oct. 25, 1961
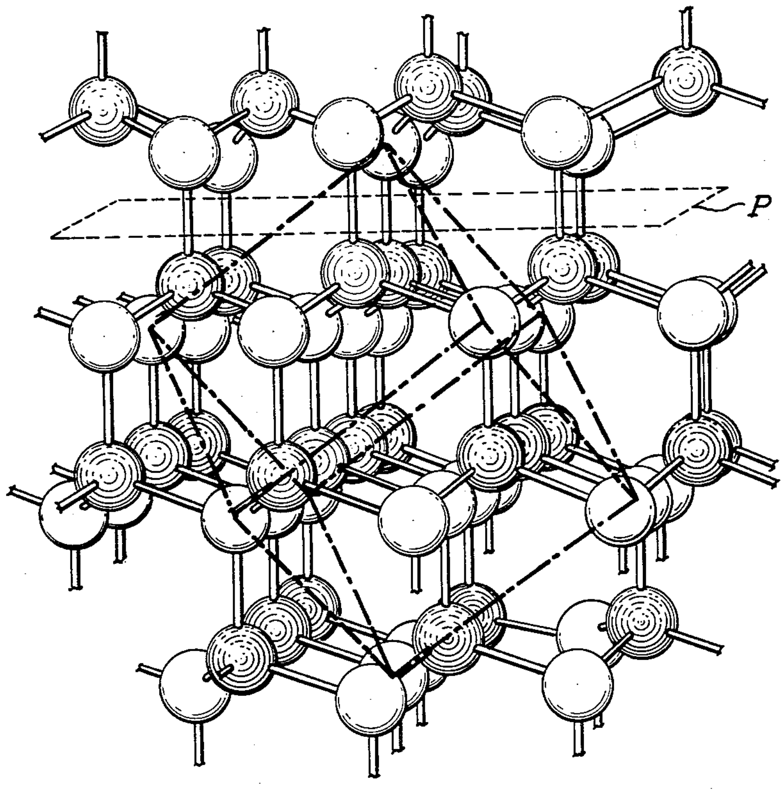
INVENTOR
Miriam T. Minamoto
BY
Pennie Edmonds Morton Barrows & Taylor
ATTORNEYS United States Patent Office 3,152,023
Patented Oct. 6, 1964

3,152,023
METHOD OF MAKING SEMICONDUCTOR DEVICES

Miriam T. Minamoto, East Northport, N.Y., assignor to Cutler-Hammer, Inc., Milwaukee, Wis., a corporation of Delaware Filed Oct. 25, 1961, Ser. No. 147,606
11 Claims. (Cl. 148—177)

This invention relates to the manufacture of semiconductor devices, and is particularly concerned with the manufacture of such devices from single crystals of diatomic semiconductor compounds. The invention provides means for preparing semiconductor devices from such compounds under conditions which avoid production of inordinate numbers of defective or sub-standard devices. This result is achieved by selectively treating the (−111) face (or equivalent face) of the crystal chip with an element which alloys with the semiconductor compound to provide electron donors or electron acceptors in the crystal lattice. By thus treating the properly selected faces of the chips, the inordinately high proportion (exceeding 50%) of defective devices not meeting reasonable standards of performance, which are produced when randomly-selected crystal faces are treated with the donor or acceptor elements, is reduced to a much more modest proportion.

In recent years the art of making semiconductor devices (diodes, transistors, photo cells, Hall-effect devices, etc.) has been well developed. The art is largely based on the use of monatomic semiconductors, especially germanium and silicon, as the basic material of such devices. Useful devices are prepared from these semiconducting materials by establishing electrically rectifying boundaries within them. Originally such boundaries were formed adjacent the point of contact of a conductive whisker to the body of the crystal of the semiconducting material; but subsequently means were developed for establishing rectifying boundaries in the form of p-n junctions in the body of the crystal. Presently the vast majority of semiconductor devices are based on a semiconductor single crystal in which one or more p-n junctions have been established and to which conductive leads are attached on opposite sides of such junctions.

In recent years considerable interest has developed in utilizing semiconductive diatomic compounds, instead of monatomic silicon or germanium, to form the semiconductor single crystal chips from which semiconductor devices are made. The use of such compounds considerably broadens the range of physical properties made available to semiconductor devices and thus makes possible the production of devices over a considerably broader spectrum of specification ranges than can be produced from germanium and silicon. The diatomic compounds which have engendered greatest interest are the so-called III–V compounds, which are intermetallic compounds of elements of Groups III–A and V–A of the periodic table, that is, they are composed of an element of Groups III–A and an element of Group V–A in definite proportions. However, diatomic semiconducting compounds of other types, e.g., II–VI compounds (diatomic compounds of elements of Groups II–B and VI–A), may also be employed.

The use of diatomic semiconducting compounds introduces problems in the manufacture of semiconductor devices which have no counterpart in the manufacture of such devices for monatomic semiconductors. One outstanding difficulty heretofore encountered is the inordinately high proportion of the devices prepared from a given diatomic compound that are defective in that they exhibit no rectifying action or fail to meet the most reasonable electrical performance standards. Considerably more than 50% of semiconductor devices prepared from crystals of diatomic semiconducting compounds fail completely or do not meet reasonable performance specifications. Heretofore this high proportion of faulty devices out of each batch prepared from a diatomic semiconducting compound has been accepted as normal in the fabrication of diatomic compound semiconductor devices.

It has heretofore been recognized that a significant difference between diatomic and monatomic semiconductor single crystals resides in the fact that opposite faces of the former often display polarized characteristics whereas there is no evident difference between opposite faces of the latter. The difference stems from the fact that when a single crystal of a diatomic semiconductor compound is cut on a plane along which it may readily be severed (e.g., the 111 plane of a crystal of cubic habit) the faces on the opposite sides of the cut are defined by surface layers of dissimilar atoms. For example, when a III–V compound is thus cut, severing of the crystal takes place between a layer of Group III atoms and a layer of Group V atoms. In consequence, the surface of the compound on one side of the cut is defined by atoms of the Group III compound and the surface of the opposite side of the cut is defined by atoms of the Group V compound. A wafer or chip of such compound cut on the 111 plane therefore has one face defined by a layer of atoms of one group and the opposite face defined by a layer of atoms of the other group. Likewise, the opposite faces of a diatomic crystal of hexagonal symmetry which has been cut along a favorable cleavage plane are defined by dissimilar atom layers. It is from this dissimilarity in the surface layer of atoms that the polarized characteristic of the crystal is derived.

I have found that advantage may be taken of this polarized nature of the opposite faces of a slice on a favorable cleavage plane of diatomic semiconductor crystals to eliminate the high proportion of defective semiconductor devices that heretofore have invariably accompanied the production of such devices from such crystals. This result is achieved by the manner in which a semiconductor crystal slice (or chip) is treated to form the p-n junction within it. By selectively alloying the electron donor or acceptor, with the face defined by those atoms of the compound having the larger number of electrons in their outer shells, and by selectively avoiding thus alloying the opposite face, the proportion of defective devices is reduced to a modest proportion (typically under 20%, in comparison with the heretofore normal proportion of over 50%).

In its broad aspects the invention is applicable to the manufacture of semiconductor devices from any diatomic semiconductor compound which may be cut on a plane defined on opposite sides by dissimilar substantially monatomic layers of the two different atoms making up the compound, so that opposite parallel faces of a single crystal chip of such compound, when cut on such plane, in consequence of the dissimilar surface atom layers exhibit polarized properties. The invention therefor contemplates, in its broad aspects, forming a p-n junction in such single crystal chips, cut on planes of ready cleavage which result in formation of such dissimilar opposite faces, by selectively depositing a third element capable of functioning as an electron acceptor or donor in the crystal structure on that face of each chip which is defined by those atoms of the compound having the greater number of electrons in their outer shells, and then heating the chips sufficiently to fuse said third element in contact therewith. Thereafter the chips are cooled to form a structure in which the third element is selectively alloyed with the semiconductor compound adjacent that face on which it was initially deposited while the semiconductor compound adjacent the opposite face of the chip (defined by the layer of atoms having the lesser number of electrons in their outer shells) remains selectively unalloyed with such third element.

The better known diatomic semiconductor compounds, with respect to which the invention is particularly applicable, for the most part form crystals which possess a cubic symmetry; and in such crystals the preferential planes of cleavage along which cutting takes place, and which are defined on opposite sides by monatomic layers of the two different atoms of the compound, are the 111 planes. Various conventions have been adopted in the literature to denote the polarity of the opposite faces of a slice on the 111 plane of a diatomic semiconductor. For reasons of typographical convenience, the surface defined by the atoms of the element having the greater number of electrons in its outer shell is herein referred to as the (—111) surface; and the surface defined by the atoms of the element having the lesser number of electrons in its outer shell is termed the (+111) surface. In the case of a III–V compound, for example, the surface defined by a layer of atoms of the element of Group V is the (—111) surface, and the surface defined by the atoms of the element of Group III is the (+111) surface. In the case of specific compounds, such as indium antimonide, the opposite surfaces are herein sometimes identified by substituting the chemical symbol of the appropriate atom for the (+) or (—) signs (e.g., In-111 instead of (+111) for the surface defined by indium atoms, and Sb–111 instead of (—111) for the surface defined by antimony atoms).

The invention therefore provides, in the manufacture of semiconductor devices in which a diatomic semiconducting compound of cubic crystal habit is formed into single crystal chips each having opposite substantially parallel faces conforming substantially to the 111 plane of the crystal and in which a third element is introduced into each such chip to establish a p-n junction therein, the improvement which comprises selectively depositing said third element on the (—111) faces (defined by those atoms of the compound having the greater number of electrons in their outer shells), heating said chips sufficiently to fuse said third element in contact therewith, and thereafter cooling said chips to form in each a structure having said third element alloyed with the semiconductor compound adjacent the (—111) face while the compound adjacent the opposite (+111) face remains substantially unalloyed with such third element. Thus, in the quantity manufacture of semiconductor devices each comprising a III–V compound single crystal chip having opposite substantially parallel faces conforming substantially to the 111 plane of the crystal and having a third element alloyed therewith to form a p-n junction therein, the invention provides the improvement which comprises selectively orienting a multiplicity of such chips to expose the (—111) faces thereof, applying said third element selectively to said exposed faces, heating said chips to a temperature at which said third element fuses thereon and alloys therewith, and thereafter cooling the chips to form in each a structure having said third element alloyed with the semiconductor compound adjacent the (—111) face while the compound adjacent the opposite (+111) face remains substantially unalloyed with said third element.

The invention is described more particularly below with reference to the manufacture of a diode of indium antimonide, a typical III–V compound having the crystal structure portrayed in the single figure of the accompanying drawing. The drawing shows schematically the cubic crystal pattern generally characterized as the zinc blende structure, for it was first established as the crystal lattice structure of zinc sulfide. It is particularly discussed below with reference to the crystal structure of III–V compounds, especially indium antimonide, for which case the more darkly shaded spheres shown in the drawing represent the Group V or antimony atoms, and the lightly shaded spheres represent the Group III or indium atoms. The unit cell of the crystal is outlined by the heavy dash-dot lines. The orientation of the crystal structure as shown in the drawing is with the 111 plane extending laterally across and approximately perpendicular to the plane of the drawing, so that the Sb–111 face is at the top of the drawing and the In–111 surface is at the bottom.

When a crystal structure of the character shown in the drawing is sliced on a 111 plane, severing of the structure is most readily accomplished between atoms that are singly bonded to neighboring atoms. It will be noted that layers of antimony atoms are singly bonded to the adjacent overlying layers of indium atoms in the structure as shown in the drawing, whereas each such antimony atom is triply bonded to the indium atoms in the underlying layer. Evidently for this reason, and possibly also on account of the geometric arrangement of the indium and antimony atoms relative to each other, cutting of the crystal on the 111 plane results in severing it substantially along a plane P. It will be noted that the surface of the crystal below this plane is defined by antimony atoms, and the surface above it is defined by indium atoms. By like token, a wafer sliced on the 111 plane from the crystal structure shown in the drawing will have one surface defined by antimony atoms and the opposite surface defined by indium atoms. Indeed, the drawing portrays a cross-section through such a slice several atoms thick, in which antimony atoms define the upper surface and indium atoms define the lower surface.

In fabricating diodes from indium antimonide in accordance with the invention, indium antimonide single crystals of high purity are conventionally prepared and sliced on the 111 plane into wafers of desired thickness. The orientation of the slicing should be held as closely as possible to that of the 111 plane, preferably within 1°. However, satisfactory devices can be made from slices cut on an angle departing as much as 5° from the true orientation of the 111 plane. The slices are lapped and polished using conventional methods and techniques, and are etched with conventional etchants.

One of the polar characteristics of 111 slices of diatomic compounds is that etching characteristics of opposite faces differ. Hence somewhat different etchants may with advantage be used on the opposite faces. Use of the same etchant on both faces generally results in a somewhat different appearance of one face from the other after etching. This difference in appearance may be employed to identify the (—111) and (+111) faces. For example, the (+111) surface of indium antimonide may be etched with a solution composed of one part concentrated hydrofluoric acid and four parts of concentrated nitric acid, but this etchant leaves the (—111) surface discolored. By diluting the above etchant with 6 parts of water, it is made suitable for etching the (—111) surface. The diluted etchant when applied to the (+111) surface, however, leaves it discolored.

After etching, the slices are subdivided into chips of desired dimensions, and in accordance with the invention the chips are all oriented on a supporting plate with their (—111) faces, that is, the Sb–111 faces, uppermost. The small quantity of a third element capable of serving as an electron donor or electron acceptor in the semiconductor lattice structure is then applied to the upper faces of each chip. For example, cadmium functions as an electron acceptor in the indium antimonide, and by incorporating a small amount of cadmium into the lattice structure, p-type indium antimonide is formed. A number of other elements such as zinc, sodium and magnesium are capable of functioning similarly, but their incorporation into an indium antimonide crystal is difficult and hence they are not preferred.

The cadmium (or other third element) may be applied in the form of a small button placed on the upward facing (—111) surface of each chip, or may be applied in any other desired fashion, for example, by vapor deposition. In any event, after it has been applied, it is heated in a suitable atmosphere (or, in some cases, in a vacuum) to a high enough temperature to fuse it with the (−111) face of the crystal chip and to alloy it therewith. Thereafter, the fusion is cooled sufficiently to resolidify, with the result that the indium antimonide adjacent the (−111) face becomes alloyed with the cadmium and thus converted to p-type compound, whereas the indium antimonide adjacent the opposite (+111) face of the crystal chip remains essentially unalloyed and retains the n-type characteristics of highly purified indium antimonide. A p-n junction within the indium antimonide crystal is thus established.

The resulting chips are fabricated into diodes by conventional techniques and practices. For example, lead wires may be attached to the opposite faces of the chips by means of suitable solders which make good ohmic contact with the crystal without effecting its semiconducting characteristics. Tin is a satisfactory material with which to bond leads to the (+111) face of indium antimonide, and indium may be used successfully to bond leads to the cadmium alloyed p-type indium antimonide at its (−111) face. The devices thereafter may be treated with suitable etchants to clean up the junction, and they may then be potted or otherwise treated in any conventional manner to protect them from mechanical injury and from chemical attack.

Indium antimonide diodes prepared as described above, having a p-n junction developed by alloying the (−111) face of the crystal with cadmium, characteristically display a high break-down voltage (10–16 volts) and low reverse current. Only a modest proportion (less than 20%) of diodes thus prepared fail to meet standard semiconductor rectifier specifications.

Diodes prepared as described above but with the cadmium purposely alloyed to the (+111) face of the crystal chips (contrary to the method of the invention), consistently displayed poor electrical characteristics, and frequently possessed no rectifying capability whatever. Such devices typically displayed a break-down voltage in the neighborhood of 1.5, and relatively high reverse currents were observed in such of these devices as possessed any rectifying properties. Electically shorted junctions in these devices were also commonly observed, and could not be eliminated even with repeated etching.

The foregoing exemplary description of the production of diodes based on the use of indium antimonide as the diatomic semiconductor is applicable also to the production of diodes of other III–V semiconductor materials. For example, diodes may be prepared from gallium arsenide by essentially the same procedures described above for making indium antimonide diodes. Generally similar procedures are applicable to the production of yet other diodes of III–V semi-conductors, including for example aluminum phosphide, aluminum arsenide, aluminum antimonide, gallium phosphide, gallium antimonide, indium phosphite, and indium arsenide. Generally similar procedures may be followed also to produce diodes utilizing other classes of diatomic semiconductor compounds, such as II–VI compounds, e.g., cadmium sulfide, cadmium selenide, zinc sulfide, and zinc telluride. The method of the invention basically is the same whether the semiconductor is of cubic or other (e.g., hexagonal) crystal habit. Essentially, the method in each case is based on applying the element responsible for formation of the p-n junction to that face of a single crystal chip of the chosen semiconductor material which is defined by a substantially monatomic layer of the atoms of the compound having the greater number of electrons in their outer shells, and fusing such element in contact with such face so as to form a ternary alloy thereof with that portion of the semiconductor compound adjacent that face, while leaving the binary semiconductor material adjacent the opposite face of the crystal essentially unalloyed with third elements.

In the foregoing example, cadmium has been particularly mentioned as an alloying element for forming a p-n junction in indium antimonide. As noted above, other elements of Groups I and II are also capable of functioning as electron acceptors in indium antimonide. These same elements may also be alloyed in accordance with the invention with other III–V compound single crystals to form p-n junctions therein. Other elements also may, in accordance with known practices, be used as electron acceptors or donors. Elements of Group IV (e.g., tin, germanium and silicon) and elements of Group VI (e.g., selenium, tellurium and sulfur) can in appropriate cases be used as electron donors in diatomic semiconductor crystals. Of course, it is equally possible to make semiconductor devices from a normally p-type diatomic semiconductor by alloying an electron donor therewith in accordance with the method of the invention, as to make such devices from a normally n-type material by alloying an electron acceptor therewith. The invention, however, is not concerned with the use of any particular electron acceptor or donor. Any element capable of so functioning in a diatomic semiconductor crystal may be employed.

The third element which is alloyed with the diatomic semiconductor compound may be applied to the (−111) face (or other face defined by a substantially monatomic layer of atoms of the higher numbered group) of the crystal chip either in substantially pure form, or in the form of an alloy with one or more other elements. It may be applied by mechanically depositing it in the form of a small bead on the selected crystal face, or it may be applied by vapor deposition, electrodeposition, sputtering, or any other desired technique. Since only a minute quantity is required to alloy with the semiconductor compound, it is often desirable to apply it in the form of an alloy. Such alloy should in addition to the chosen third element, be made up of elements which do not adversely effect the semiconducting properties of the particular semiconductor compound used. Generally speaking the alloy will include, in addition to the third element, one or more metals which yield an alloy of relatively low melting temperature. A low-melting alloy comprising the third element and one or more elements of Groups III–A or IV–A is often satisfactory, for usually such an alloy, in addition to providing a convenient means for supplying the third element in the desired small quantity to the selected face of the semiconducting crystal also serves to provide for making good ohmic contact therewith and for bonding leads thereto without adversely affecting its semiconducting properties.

Particular mention has been made above of the fabrication of diodes in accordance with the invention. Such devices have been particularly described by way of example, since they represent the simplest class of semiconductor devices. However, the invention is not limited thereto. All other types of semiconductor devices which are based on the establishment of one or more p-n junctions within a single crystal of a diatomic semiconductor compound may be made in accordance with the invention. For example, transistors, semiconductor photocells, and semiconductor Hall-effect devices may be prepared in accordance with the method of the invention. In all such cases, the invention contemplates forming the one or more p-n junctions in a single crystal of a diatomic semiconductor compound by applying the junction-forming third element to an exposed face of a single crystal chip of the semiconductor, which face is defined by a monatomic layer of those atoms of the compound having the greater number of electrons in their outer shells, and then fusing such element in contact with such crystal face so as to alloy it with the semiconductor compound adjacent such face and thus incorporate it into the semiconductor lattice.

It is thus apparent that the essential characteristic of the invention resides in taking advantage of the polarized nature of the opposite 111 faces of diatomic semiconductor cubic single crystal chips, or the similarly polarized opposite faces of crystals of other forms of symmetry, by selectively alloying the electron acceptor or donor with the (−111) face, or other face defined by a monatomic layer of the atoms having the larger number of electrons in their outer shells, and selectively avoiding such alloying with the (+111) face or other opposite face. The former is the face which I have found accepts alloying with the third element with minimum damage to the semiconducting properties of the crystal and with the formation of a p-n junction having optimum electrical properties. When no attention is paid to the polar characteristics of such opposite faces of diatomic semiconductor crystal chips in the preparation of diodes and other p-n junction devices, somewhat over half of the devices prepared will generally be found defective, owing to the statistical probability that in half the cases the electron acceptor or donor will become alloyed at the face defined essentially by the atoms having the smaller number of electrons in their outer shells, rather than at the opposite face. The high proportion of faulty devices attributable to this statistical distribution of the crystal faces presented for alloying when no care is taken to select the proper face, is eliminated by the method of the invention.

A further consequence of alloying the electron acceptor or donor to the (−111) face of a diatomic semiconductor cubic crystal is that the p-n junction formed thereby is planar and lies on the 111 planes of the crystal. Such junctions characteristically possess optimum electrical properties. When the electron acceptor or donor is alloyed to the (+111) face of such crystal, roughly spherical junctions, concave toward the (+111) face, are formed. These junctions typically possess poor electrical characteristics and are difficult or even impossible to free of defects and shorts by etching or other treatment after alloying.

I claim:

1. In the manufacture of semiconductor devices in which a diatomic semiconducting compound is formed into single crystal chips each having opposite substantially parallel faces defined respectively by substantially monatomic layers of the two different elements of the compound, and in which a third element is introduced into each such chip to establish a p-n junction therein, the improvement which comprises selectively depositing said third element on that face of each crystal which is defined by the atoms of the compound having the greater number of electrons in their outer shells, heating said chips sufficiently to fuse said third element in contact therewith, and thereafter cooling said chips to form in each a structure having said third element selectively alloyed with the semiconductor compound adjacent the face defined by those atoms having the greater number of electrons in their outer shells while the compound adjacent the opposite face remains substantially unalloyed with such third element.

2. In the quantity manufacture of semiconductor devices each comprising a diatomic semiconductor single crystal chip having opposite substantially parallel faces conforming to a plane of ready cleavage defined on opposite sides by dissimilar substantially monatomic layers of the two atoms of the compound, whereby said opposite chip faces exhibit polarized properties, said chip having a third element alloyed therewith to form a p-n junction therein, the improvement which comprises selectively orienting a multiplicity of such chips to expose those faces thereof which are defined by the monatomic layers of atoms of the compound having the greater number of electrons in their outer shells, depositing said third element on the thus-exposed face of each of such chips, heating said chips to a temperature at which said third element fuses with a portion of said compound and alloys therewith, and thereafter cooling the chips to form in each a structure having said third element selectively alloyed with the semiconductor compound adjacent the face to which said third element was originally applied while the compound adjacent the opposite face remains substantially unalloyed with said third element.

3. In the manufacture of semiconductor devices in which a diatomic semiconducting compound is formed into single crystal chips of cubic symmetry each having opposite substantially parallel faces conforming substantially to the 111 plane of the crystal and in which a third element is introduced into each such chip to establish a p-n junction therein, the improvement which comprises selectively depositing said third element on the (−111) faces defined by those atoms of the compound having the greater number of electrons in their outer shells, heating said chips sufficiently to fuse said third element in contact therewith, and thereafter cooling said chips to form in each a structure having said third element selectively alloyed with the semiconductor compound adjacent the (−111) face while the compound adjacent the opposite (+111) face remains substantially unalloyed with such third element.

4. The method according to claim 3, in which the third element is a metal and is deposited on the (−111) face of the chip in the form of an alloy with at least one of the elements of the semiconducting compound.

5. The method according to claim 3, in which the diatomic semiconducting compound is a III–V compound.

6. The method according to claim 5, in which the third element is a metal of the group consisting of cadmium, zinc, sodium and magnesium.

7. The method according to claim 5, in which the diatomic semiconducting compound is indium antimonide.

8. The method according to claim 7, in which the third element is cadmium.

9. The method according to claim 8, in which the cadmium is deposited on the Sb−111 face of the chip in the form of a cadmium-indium alloy.

10. The method according to claim 5, in which the semiconducting compound is gallium arsenide.

11. In the quantity manufacture of semiconductor devices each comprising a III–V semiconductor single crystal chip having opposite substantially parallel faces conforming substantially to the 111 plane of the crystal and having a third element alloyed therewith to form a p-n junction therein, the improvement which comprises selectively orienting a multiplicity of such chips to expose the (−111) faces thereof, applying said third element selectively to said exposed faces, heating said chips to the temperature at which said third element fuses thereon and alloys therewith, and thereafter cooling the chips to form in each a structure having said third element selectively alloyed with the semiconductor compound adjacent the (−111) face while the compound adjacent the opposite (+111) face remains substantially unalloyed with said third element.

References Cited in the file of this patent

UNITED STATES PATENTS

| | | |
|---|---|---|
| 2,825,667 | Mueller | Mar. 4, 1958 |
| 2,971,869 | Taylor | Feb. 14, 1961 |

OTHER REFERENCES

Physical Review, vol. 121, pp. 1093–1100, February 15, 1961, D. Haneman.

Journal of Applied Physics, vol. 29, July 1958, pp. 1131–1132, M. C. Lavine et al.

Journal of the Electrochemical Society, vol. 107, pp. 427–433, May 1960, H. C. Gatos et al.